United States Patent [19]

Mochizuki et al.

[11] Patent Number: 4,989,182
[45] Date of Patent: Jan. 29, 1991

[54] DYNAMIC RANDOM ACCESS MEMORY HAVING DUMMY WORD LINE FOR FACILITATING RESET OF ROW ADDRESS LATCH

[75] Inventors: Hirohiko Mochizuki; Tsuyoshi Ohira, both of Kawasaki; Yukinori Kodama, Yokohama; Meiko Kobayashi, Tokyo; Takaaki Furuyama, Kawasaki, all of Japan

[73] Assignee: Fujitsu Limited, Kawasaki, Japan

[21] Appl. No.: 254,153

[22] Filed: Oct. 6, 1988

[30] Foreign Application Priority Data

Oct. 6, 1987 [JP] Japan .................................. 62-251983

[51] Int. Cl.⁵ .......................... G11C 7/00; G11C 8/00
[52] U.S. Cl. .................................... 365/210; 365/194; 365/233
[58] Field of Search ............... 365/194, 210, 233, 230; 307/543

[56] References Cited

U.S. PATENT DOCUMENTS

| 4,338,678 | 7/1982 | Akatsuka | 365/174 |
| 4,556,961 | 12/1985 | Iwahashi et al. | 365/194 |
| 4,599,525 | 7/1986 | Tzeng | 307/543 |
| 4,644,501 | 2/1987 | Nagasawa | 365/210 |
| 4,680,735 | 7/1987 | Miyamoto et al. | 365/210 |
| 4,710,902 | 12/1987 | Pelley, III et al. | 365/222 |

OTHER PUBLICATIONS

Prince, B., "Semiconductor Memories", Wiley, N.Y., 1983, p. 43.

Primary Examiner—Stuart N. Hecker
Assistant Examiner—Michael A. Whitfield
Attorney, Agent, or Firm—Staas & Halsey

[57] ABSTRACT

A dynamic random access memory includes a dummy word line which has an electrical characteristic identical to that of an actual word line. The dummy word line is charged up and is then discharged as in case of the actual word line. A latched row address in a row address latch circuit is reset when the potential of the dummy word line becomes equal to a predetermined low potential due to the discharge operation for the dummy word line.

9 Claims, 10 Drawing Sheets

DYNAMIC RANDOM ACCESS MEMORY HAVING DUMMY WORD LINE FOR FACILITATING RESET OF ROW ADDRESS LATCH

BACKGROUND OF THE INVENTION

The present invention generally relates to a dynamic random access memory, and in particular to a dynamic random access memory of an address multiplex type. More particularly, the present invention relates to a dynamic random access memory in which a row address signal is released from a latched state in response to an actual change in potential of a word line.

Generally, a dynamic random access memory (hereafter simply referred to as a DRAM) is suitable for obtaining an increased integration density, because it may be constructed of a smaller number of elements than a static random access memory (hereafter simply referred to as a SRAM). Therefore, the cost for manufacturing a DRAM is less than that for manufacturing a SRAM. For the above reasons, DRAMs are widely used as a main memory and various memory devices.

An address multiplex type DRAM has an addressing operation as described below. At the commencement of the addressing operation, a row address strobe signal is switched to a low level (a ground level, for example). Then, an external address signal is latched in response to a rise in level of a latch enable signal. Next the latched external address signal is decoded by a row address decoder to generate a row address, and then one of the word lines of a memory cell array is selected. On the other hand, the external address signal is latched in response to a rise of another latch enable signal, after the row address is latched. At this time, a column address strobe signal is kept at the low level. Then the latched external address signal is decoded to generate a column address, and one of the bit lines is selected. In this manner, a memory cell positioned at an intersection of the designated word line and bit line can be selected. Thereby, a datum can be written into or read out from the designated memory cell. After that, the row address strobe signal is switched to a high level (a positive power source voltage $V_{DD}$, for example), and then the selected word line is discharged. During the discharge of the selected word line, the row address is kept latched. Thereafter, the row address is released from the latched state. Finally, the word lines are charged up to the $V_{DD}$ level for the next read or write operation.

It is noted that the row address must be kept latched during the time when the selected word line is discharged. This is because the selected word line is discharged through the address decoder. If the row address is released from the latched state before the selected word line is completely discharged, an erroneous operation may occur.

Since the row address is supplied to the memory cell array and thereafter the column address is supplied thereto as described above, it is unnecessary to simultaneously enter the row address and the column address into the memory cell array. For this reason, it is possible to use an address line and an address pin commonly for the row and column addresses. This makes it possible to attain a reduced package size and a reduced number of signal lines formed around the DRAM device, so that the density in arrangement of devices on a printed circuit board, can be enhanced.

However, the above conventional DRAM has the following disadvantages. The row address is released from the latched state when a constant time elapses after the rise of the row address strobe signal. This releasing operation is carried out irrespective of the actual change in potential of the selected word line. Therefore, the above constant time must be selected by taking into consideration an operational margin and dispersion of characteristics over DRAM devices due to the production process. That is, the constant time must be selected so as to be equal to or more than a time amounting to the sum of a time when the selected word line is anticipated to become equal to zero potential, and a time margin. For this reason, one cycle of the write or read operation is lengthened by the time margin. This causes a decreased quantity of information to be handled per a unit time.

On the other hand, if the constant time for the release from the row address latch is shortened so as to obtain a reduced time margin, the external address may be released from the latched state before the selected word line completely becomes equal to zero potential. This causes an erroneous operation.

SUMMARY OF THE INVENTION

Accordingly, a general object of the present invention is to provide a dynamic random access memory in which the above disadvantages are eliminated.

A more specific object of the present invention is to provide a dynamic random access memory in which the row address is released from an latched state, depending on a change in potential of a word line, so that the row address can be released from the latched state just after the selected word line becomes equal to a predetermined low potential (zero potential, for example) without causing an erroneous operation. This results in an increased quantity of information to be handled per a unit time. The change in potential of the word line is detected by monitoring a potential change of a dummy word line which has an electric characteristic identical to that of an actual word line.

The above objects of the present invention are achieved by a dynamic random access memory which has the following elements. A memory cell array has a plurality of memory cells arranged at intersections of word lines and bit lines. A row address latch circuit latches an external address signal when a latch enable signal is switched to a first level and generates a first internal address signal. An address latch is reset when the latch enable signal is switched to a second level. A column address latch circuit latches the external address signal after the latch by the row address latch circuit and generates a second internal address signal. A row address decoder decodes the first internal address to select one of the word lines and controls a potential of the selected word line so that the selected word line is charged up to a predetermined high level and thereafter is discharged to a predetermined low level. A column address decoder decodes the second internal address signal to select one of the bit lines. A dummy word line circuit includes a dummy word line having an electrical characteristic corresponding to that of the word lines. The dummy word line is charged up and then discharged for every one cycle of a read or write operation. A timing generator generates the latch enable signal which is switched to the second level when the potential of the dummy word line is decreased to the predetermined low level due to the discharge operation for the dummy word line. Therefore, the address latched by the row address latch circuit is reset.

Other objects, features and advantages of the present invention will become apparent from the following detailed description when read in conjunction with the accompanying drawings.

DETAILED DESCRIPTION

Figure 1:
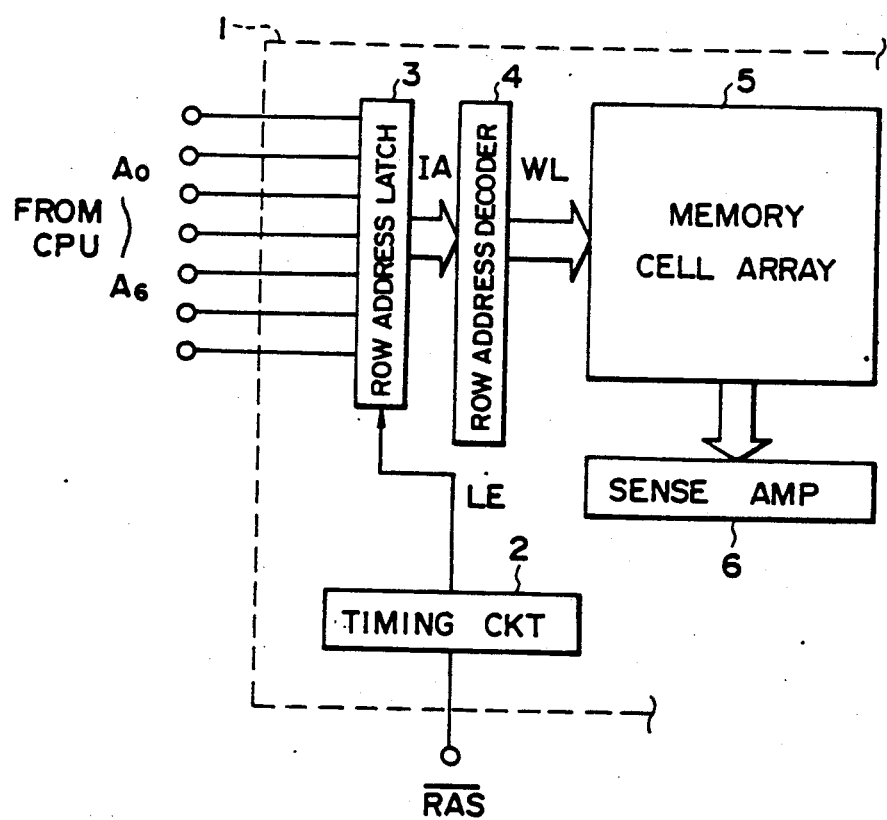
FIG. 1 is a block diagram of a portion of the conventional DRAM.
Figure 2:
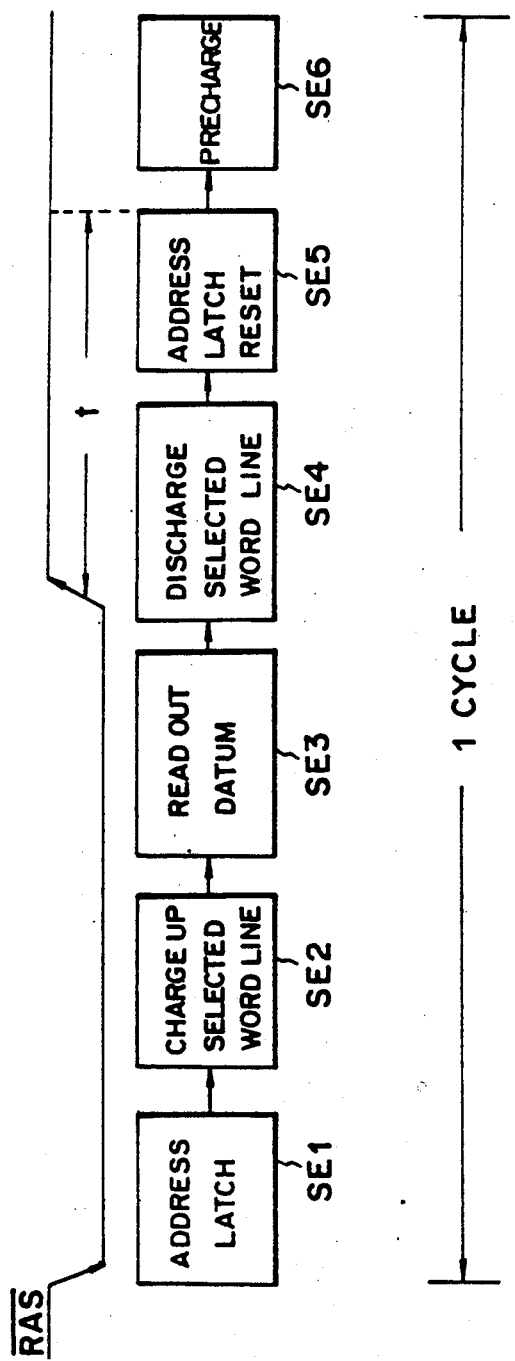
FIG. 2 is a view showing an operation sequence of the DRAM.
Figure 3:
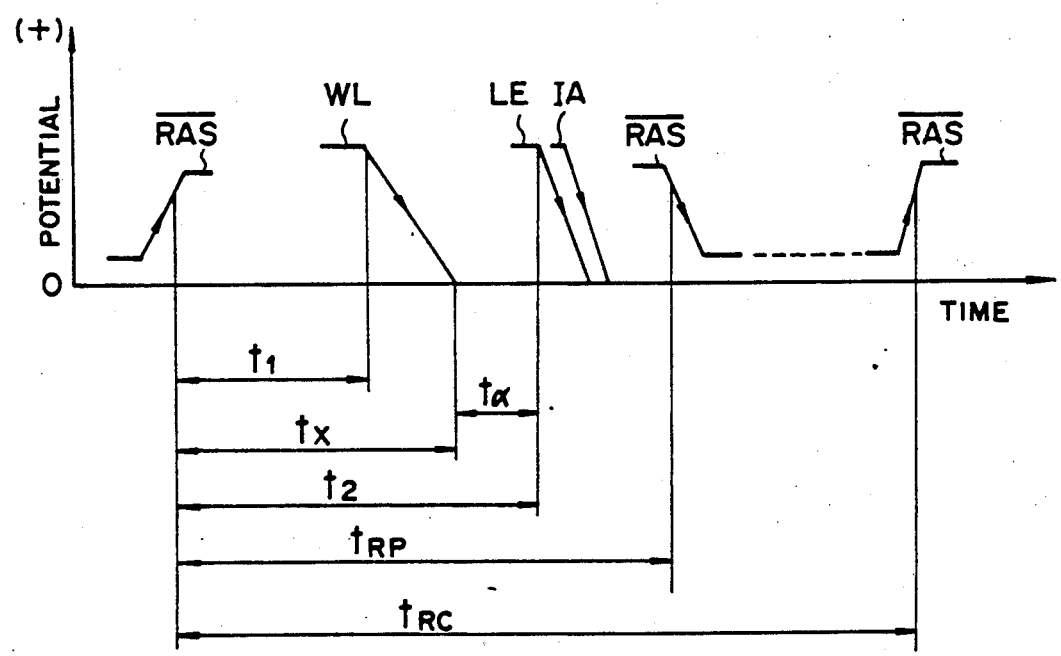
FIG. 3 is a timing chart of signals in the DRAM after a row address strobe signal $\overline{RAS}$ becomes inactive.

To facilitate the understanding of the present invention, a description is given of a conventional DRAM with reference to FIGS. 1 through 3.

FIG. 1 shows a portion of the conventional DRAM. A DRAM 1 is supplied, from a central processing unit (not shown: hereafter simply referred to as a CPU), with an address signal consisting of a plurality of bits ($A_0$–$A_6$ in the illustrated example) and row address strobe signal $\overline{RAS}$ which is a low-active signal. The row address strobe signal $\overline{RAS}$ is changed in level as shown in FIGS. 2 and 3. The row address strobe signal $\overline{RAS}$ is supplied to a timing circuit 2 of the DRAM 1. The timing circuit 2 sets a latch enable signal LE at a potential level equal to a positive power source voltage $V_{DD}$, when a predetermined constant time elapses after a fall of the row address strobe signal $\overline{RAS}$. The latch enable signal LE is supplied to a row address latch circuit 3, which latches, as a row address, the address signal which is inputted thereto just before the latch enable signal LE is set at the power source voltage $V_{DD}$. This operation is shown by an operation block SE1 of FIG. 2. Then the address latch circuit 3 generates an internal address IA from the latched row address. A row address decoder 4 selects a word line of a memory cell array 5 designated by the internal address IA. Then, the row address decoder 4 supplies the selected word line with a word line signal WL held at a potential equal to or higher than the power source voltage $V_{DD}$ (a block SE2 of FIG. 2). In other words, the row address decoder 4 increases the potential of the selected word line to the voltage $V_{DD}$ or higher.

On the other hand, a plurality of FET gates are connected to each of the word lines. The FET gates are turned ON in response to the rise in potential of the selected word line, so that memory cells (not shown) composed of the FET gates and memory elements which are connected to the selected word line, become connected to bit lines (not shown) of the memory cell array 5. Thereby, the selected memory cells become connected to a sense amplifier 6, which includes a sense amplifier circuit provided for each of the bit lines. Then when one of the sense amplifier circuits is selected by a column address generated from the external address signal, it becomes possible to write a datum in or read out a datum from the memory cell located at the intersection of the bit line associated with the selected sense amplifier circuit and the selected word line (a block SE3 of FIG. 2). Then the row address strobe signal $\overline{RAS}$ is switched to the high level. The rise of the row address strobe signal $\overline{RAS}$ is shown in FIGS. 2 and 3.

In response to the rise of the row address strobe signal $\overline{RAS}$, the DRAM is switched from an active state to an inactive state. In the active state, the data write or read operation is enabled as described above. In the inactive state, various reset operations, or initializations are enabled. Then, as shown in FIG. 3, the potential of the word line, or the word line signal WL is decreased to zero potential when a constant time $t_1$ elapses after the rise of the row address strobe signal $\overline{RAS}$ (a block SE4 of FIG. 3). Thereafter, the latch enable signal LE is decreased to zero potential when a predetermined time $t_2$ elapses after the rise of the row address strobe signal $\overline{RAS}$. In response to the fall of the latch enable signal LE, the row address signal is released from a latched state, and thereby the internal address IA is switched to zero potential, so that various reset operations including an operation for precharging the word lines for the next operation, become possible. As described previously, the address signal must be kept latched until the time when the selected word line is completely discharged, since the selected word line is discharged through the row address decoder 4.

The aforementioned conventional DRAM has the disadvantages described below. The row address is released from the latched state when the constant time $t_2$ elapses after the rise of the row address strobe signal. This releasing operation is carried out irrespective of the actual change in potential of the word line. Therefore, the constant time $t_2$ must be determined by taking into consideration an operational margin and dispersion in characteristics over DRAM devices due to the production process. That is, the constant time $t_2$ must be determined to be equal to or more than a time amounting to the sum of a time $t_x$ when the potential of the selected word line is expected to become zero potential and a time margin $t_\alpha$. For this reason, the precharge time between the rise of the row address strobe signal $\overline{RAS}$ and the fall thereof for the next read or write operation is lengthened by the time margin $t_\alpha$. As a result, a time $t_{RC}$ of one cycle of the write or read operation is necessarily lengthened. This causes a decreased quantity of information to be handled per a unit time.

On the other hand, if the constant time $t_2$ is shortened so as to obtain an reduced time margin $t_\alpha$, the address may be mistakenly released from the latched state before the selected word line completely becomes equal to zero potential. This causes an erroneous operation.

The present invention is directed to overcoming the above disadvantages of the conventional DRAM.

Figure 4:
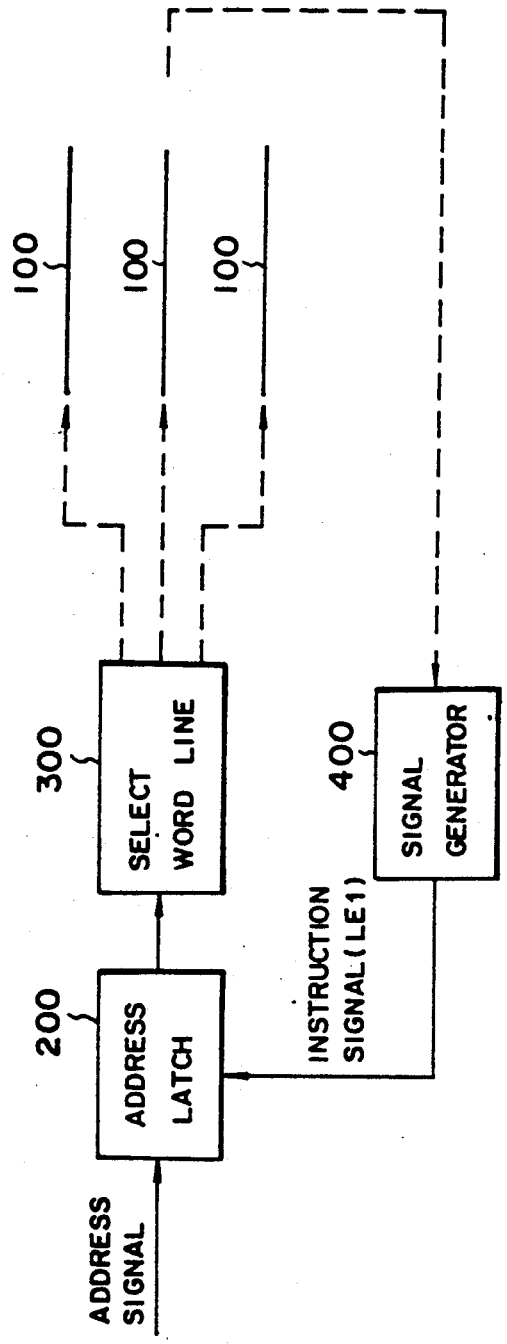
FIG. 4 is a block diagram for explaining the principle of the present invention.

A description is given of the principle of the present invention with reference to FIG. 4.

Referring to FIG. 4, an address holding circuit 200 holds, during a predetermined time, an external address signal which is supplied from an external circuit such as a CPU and which indicates one of the word lines 100 to be selected. A word line selecting circuit 300 selects the indicated word line 100 and increases the potential thereof to a predetermined high potential ($V_{DD}$). After the end of the read or write operation, the word line selecting circuit 300 decreases the potential of the selected word line to a predetermined low potential (ground). A signal generating circuit 400 generates an instruction signal (sets a latch enable signal LE1 at the low level as described later) which instructs the end of the row address latch, when the selected word line becomes equal to the predetermined low potential. As described later, a potential change of the selected word line can be detected by detecting a potential change of a dummy word line which has an electric characteristic almost the same as actual word lines. The dummy word line is charged up and is then discharged for every operation cycle.

According to the present invention, the address is released from the latched state in response to a change in potential of the word line. Therefore, the operation of the DRAM can be rapidly and correctly shifted to reset operations. Hence, the precharge time $t_{RP}$ and the cycle time $t_{RC}$ can be shortened. As a result, the quantity of data to be written into or read out from the memory cells per a unit time can be increased.

A description is given of a preferred embodiment of the present invention, by referring to FIGS. 5 through 10. The illustrated embodiment is a 16Kbit-DRAM provided by the present invention.

Figure 5:
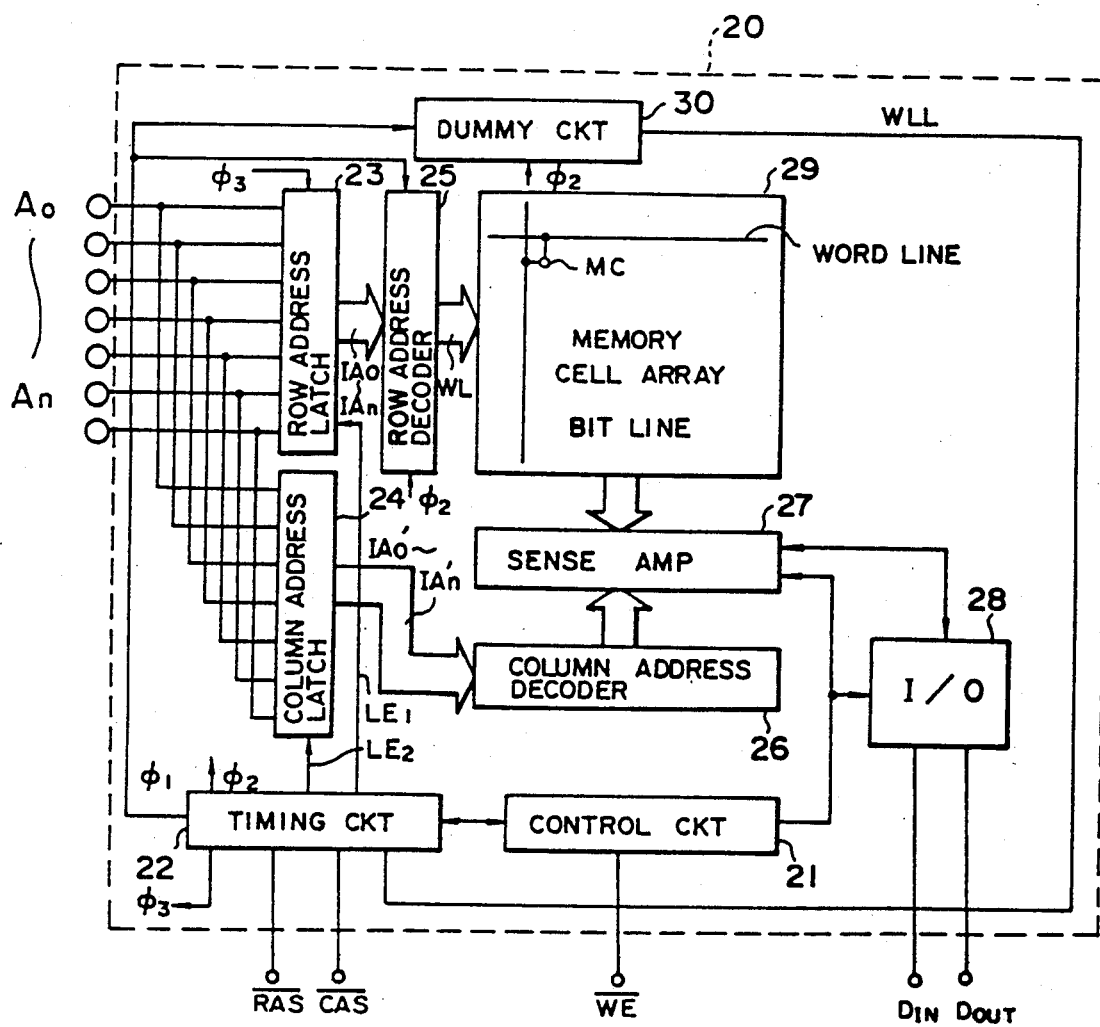
FIG. 5 is a block diagram of a DRAM provided by a preferred embodiment of the present invention.

Referring to FIG. 5, a DRAM 20 comprises the following circuits. A control circuit 21 controls an operation cycle for the write or read operation by controlling the circuits illustrated in FIG. 5. A timing circuit 22 generates various clock signals including clock signals $\phi_1$, $\phi_2$ and $\phi_3$ necessary for establishing the operation cycle, and latch enable signals LE1 and LE2. When the latch enable signal LE1 is switched to the high level, a row address latch circuit 23 latches an external address signal consisting of address bits A0–An. Thereafter, when the latch enable signal LE1 is switched to the low level, the row address latch circuit 23 ends the latch of the external address signal. A column address latch circuit 24 latches the external address bits A0–An, when the latch enable signal LE2 is switched to the high level. Thereafter, when the latch enable signal LE2 is switched to the low level, the column address latch circuit 24 ends the latch of the external address bits A0–An. The row address latch circuit 23 generates internal address signals IA0–IAn and $\overline{IA0}$–$\overline{IAn}$ based on the latched external address signal, or a row address signal. In FIG. 5, only the internal address signals IA0–IAn are shown for the sake of simplicity. The column address latch circuit 24 generates internal address signals IA0'–IAn' and $\overline{IA0'}$–$\overline{IAn'}$ based on the latched external address signal, or a column address signal. In FIG. 5, only the internal address signals IA0'–IAn' are shown for the sake of simplicity. A row address decoder 25 selects one of the word lines in accordance with the internal address signal IA0–IAn and $\overline{IA0}$–$\overline{IAn}$, and charges the selected word line up to a positive power source voltage $V_{DD}$. A column address decoder 26 selects one of the bit lines in accordance with the internal address signal IA0'–IAn' and $\overline{IA0'}$–$\overline{IAn'}$. A sense amplifier 27 compares the potential of the selected bit line with a predetermined reference potential, and reads out a datum stored in the designated memory cell in the read operation, for example. An input/output circuit (hereafter simply referred to as an I/O circuit) outputs the datum supplied from the sense amplifier 27, as an output datum Dout, to an external circuit, and supplies the sense amplifier 27 with an input datum Din supplied from the external circuit. A memory cell array 29 contains a plurality of memory cells MCs which are located at intersections of the word lines and bit lines. A dummy circuit 30, which is one of the essential features of the present embodiment, contains a dummy word line part which has an electric characteristic almost identical to that of actual word lines. The dummy circuit 30 generates a potential signal WLL which indicates the potential of the dummy word line part. The potential of the dummy word line part corresponds to an actual change in potential of word lines.

The memory cell array 29 contains a plurality of word lines extending in the row direction, a plurality of bit lines extending in the column direction, a plurality of memory cells composed of switching elements and memory elements. When a word line is switched to the high potential (power source voltage $V_{DD}$, for example), the switching elements connected thereto, are turned ON. Thereby the memory elements connected to the selected word line become connected to bit lines. Alternatively, the switching elements are turned OFF when the selected word line is switched to the low level (ground level, for example).

The DRAM 20 is supplied with the high-active address signal which consists of address bits A0–An, and a plurality of timing signals such as a row address strobe signal $\overline{RAS}$, a column address strobe signal $\overline{CAS}$ and a write enable signal $\overline{WE}$. The signals $\overline{RAS}$, $\overline{CAS}$ and $\overline{WE}$ are low-active signals. Further, the input and output data Din and Dout may be transmitted, in the serial form, between the DRAM 20 and the external circuit.

Figure 6:
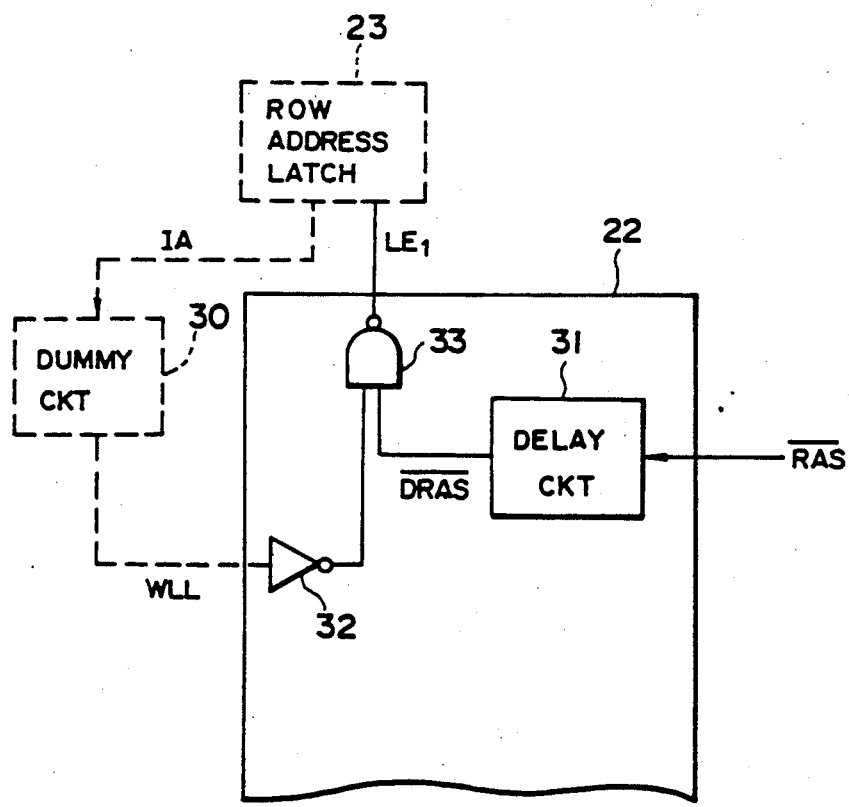
FIG. 6 is a circuit diagram of a portion of the timing circuit 22 shown in FIG. 5.

FIG. 6 shows a circuit configuration of a portion of the timing circuit 22. The illustrated circuit portion generates the latch enable signal LE1. Referring to FIG. 6, a delay circuit 31 of the timing circuit 22 delays the row address strobe signal $\overline{RAS}$ by a predetermined time, and produces a delayed row address strobe signal $\overline{DRAS}$. An inverter 32 inverts the potential signal WLL supplied from the dummy circuit 30. A NAND circuit 33 inverts the $\overline{DRAS}$ signal from the delay circuit 31 and produces an inverted $\overline{DRAS}$ signal, when an output signal of the inverter 32 is held at the high level.

An output signal of the NAND circuit 33 is supplied, as the latch enable signal LE1, to the row address latch circuit 23. The row address latch circuit 23 latches the external address bits A0–An during a time when the latch enable signal LE1 is held at the high level. That is, the latch enable signal LE1 is set at the high level by applying the $\overline{DRAS}$ signal having the low level to the NAND circuit 33, in the state when the potential signal WLL derived from the dummy circuit 30 is kept at the low level. Further, the latch enable signal LE1 is maintained high irrespective of the $\overline{DRAS}$ signal during a time when the potential signal WLL is held at the high level. Thereafter, when the $\overline{DRAS}$ signal is switched to the high level and when the potential signal WLL is switched to the low level, the latch enable signal LE1 is reset to the low level. In this manner, the latch enable signal LE1 is set at the high level by the $\overline{DRAS}$ signal, and is set at the low level by the potential signal WLL derived from the dummy circuit 30.

Figure 7:
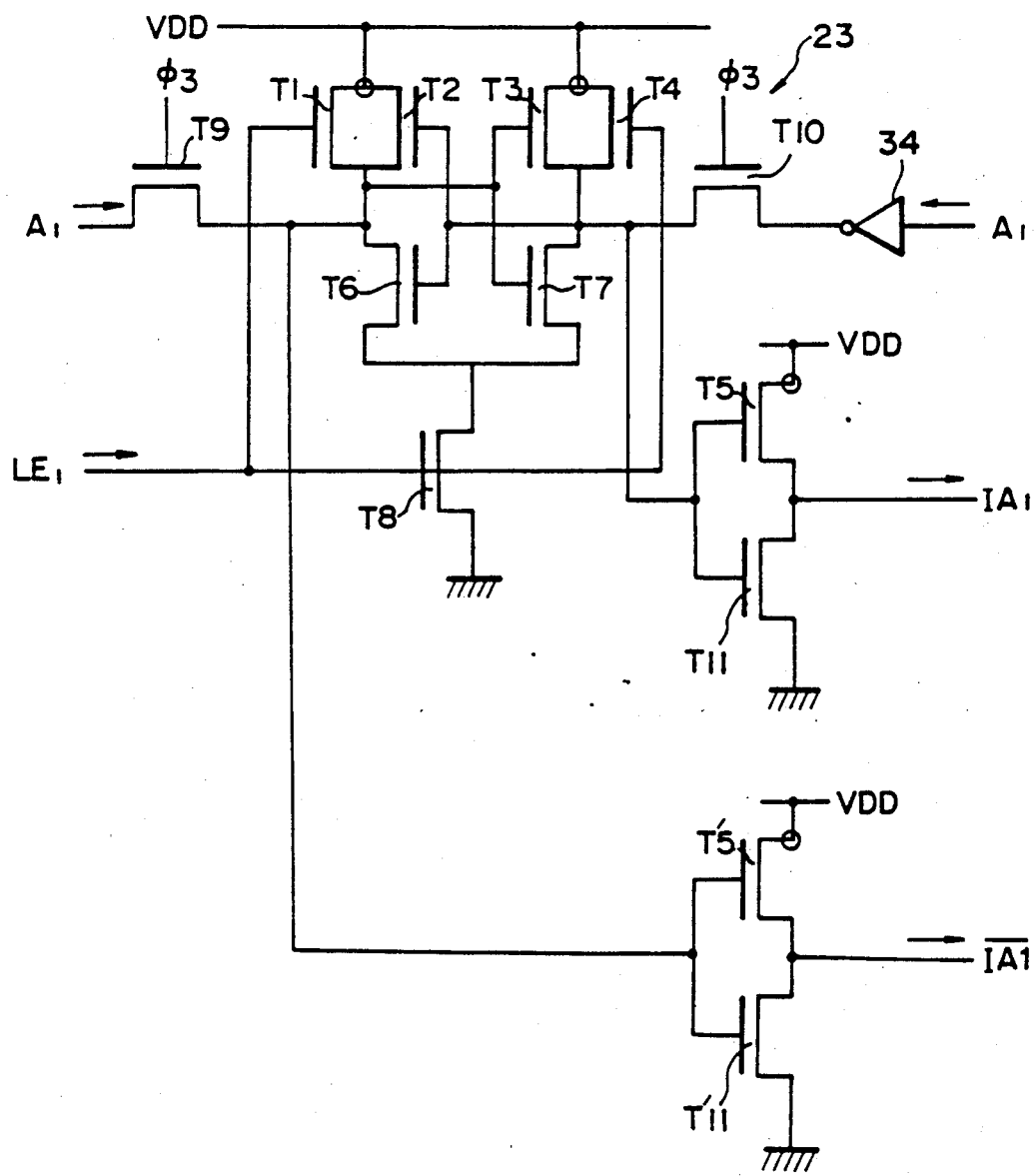
FIG. 7 is a circuit diagram of a portion of the row address latch circuit 23 shown in FIG. 5.

FIG. 7 shows a circuit configuration of a portion of the row address circuit 23. The illustrated circuit relates to the address bit A1; and the row address latch circuit 23 has the same circuit configuration for each of the other address bits A0, A2–An. Referring to FIG. 7, T1 through T5 and T5' indicate p-channel MOS transistors, and T6 through T11 and T11' indicate n-channel MOS transistors. A gate of the MOS transistor T2 is connected to a drain of the MOS transistor T3, and a gate of the MOS transistor T3 is connected to a drain of the MOS transistor T2. A gate of the MOS transistor T6 is connected to a drain of the MOS transistor T7, and a gate of the MOS transistor T7 is connected to a drain of the MOS transistor T6. The combination of the MOS transistors T2, T3, T6 and T7 implements a flip-flop. The MOS transistor T1 is connected between the drain of the MOS transistor T6 and the positive power source $V_{DD}$. The MOS transistor T4 is connected between the drain of the MOS transistor T7 and the positive power source $V_{DD}$. Mutually connected sources of the MOS transistors T6 and T7 are connected to a drain of the MOS transistor T8. A source of the MOS transistor T8 is connected to ground. The drain of the MOS transistor T6 and the gate of the MOS transistor T7 are supplied with the address signal A1 through the MOS transistor T9 which is turned ON/OFF depending on the level of the clock signal $\phi_3$ derived from the timing circuit 22. The drain of the MOS transistor T7 and the gate of the MOS transistor T6 are supplied with an inverted address signal A1 through an inverter 34 and the MOS transistor T10, which is turned ON/OFF depending on the level of the clock signal $\phi_3$. The gates of the MOS transistors T1, T4, and T8 are supplied with the latch enable signal LE1. The MOS transistors T1 and T4 are turned ON when the latch enable signal LE1 is switched to the low level. Thereby, the power source voltage $V_{DD}$ is allowed to be applied to the drains of the MOS transistors T2, T3, T6 and T7, and then the flip-flop composed of the MOS transistors T2, T3, T6 and T7 is reset. On the other hand, the MOS transistor T8 is turned ON when the latch enable signal LE1 is switched to the high level, so that the flip-flop can be activated.

The address signal A1 supplied to the flip-flop through the MOS transistors T9 and T10 turns ON/OFF the MOS transistor T6 or T7, depending on the level of the address signal A1. For example, when the address signal A1 having the high level is supplied to the flip-flop, the MOS transistor T7 is turned ON and the MOS transistor T6 is turned OFF, so that the potential at the drain of the MOS transistor T7 is latched at the low level. Then the potential of the drain of the MOS transistor T7 is outputted, as the internal address signal IA1, to the row address decoder 25 through an inverter composed of the MOS transistors T5 and T11. In this manner, the internal address signal consisting of bits IA0–IAn is provided by the row address latch circuit 23. Potential levels of the internal address bits IA0–IAn depend on potential levels of the external address bits A0–An. Similarly, an inverter consisting of the p-channel MOS transistor T5' and the n-channel MOS transistor T11' is connected to the drain of the MOS transistor T6. This inverter generates the inverted internal address bits $\overline{IA0}$–$\overline{IAn}$. The internal addresses IA0–IAn and $\overline{IA0}$–$\overline{IAn}$ are supplied to the row address decoder 25.

Figure 8:
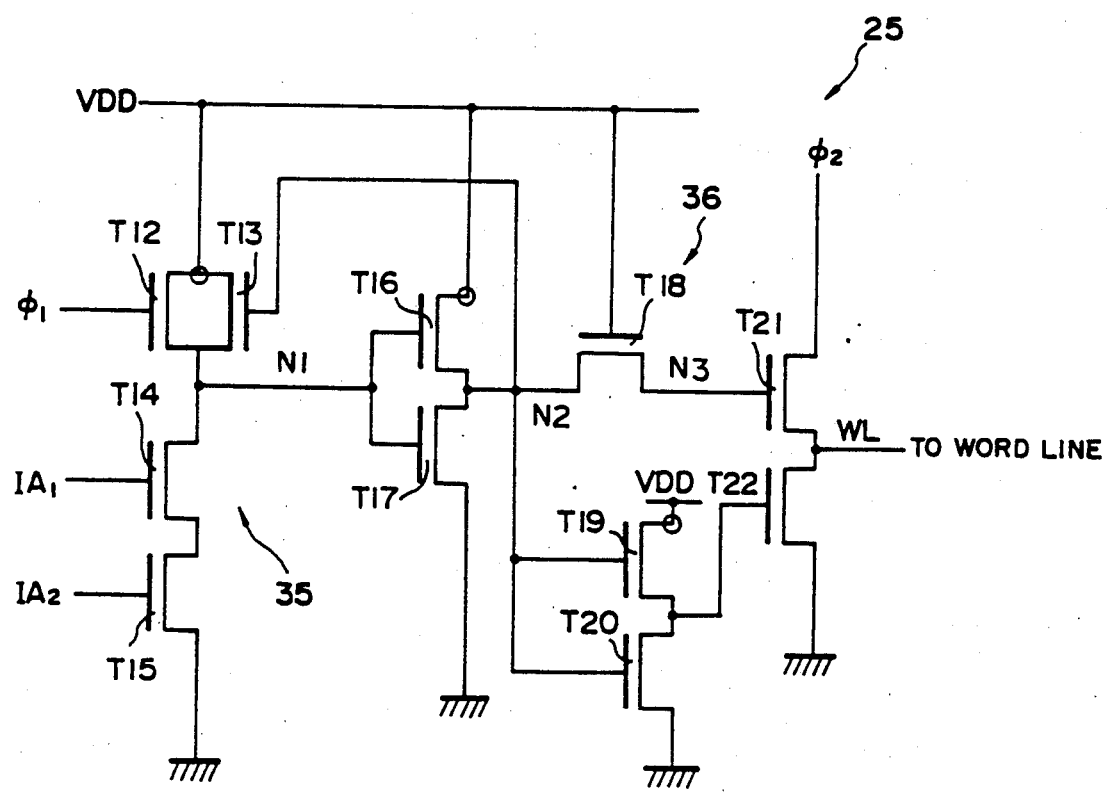
FIG. 8 is a circuit diagram of a portion of the row address decoder 25 shown in FIG. 5.

FIG. 8 shows a circuit of a portion of the row address decoder 25. The illustrated circuit relates to a word line which is selected by the internal address bits IA1 and IA2. The same circuit is provided for each of the other word lines. Referring to FIG. 8, the row address decoder 25 includes a NAND type decoder 35 and a driver 36. The NAND type decoder 35 is made up of p-channel MOS transistors T12 and T13, n-channel MOS transistors T17, which construct a CMOS inverter. The MOS transistor T12 is kept ON during a time when the clock signal $\phi_1$ is kept at the low level, and thereby charges a node N1 up to the power source voltage $V_{DD}$. When the internal address bits IA1 and IA2 are changed to the high level and thereby the NAND type decoder 35 is selected, the MOS transistors T14 and T15 are turned ON, and the node N1 is connected to ground. Thereby, the MOS transistor T16 is turned ON, so that a node N2 is charged up to the voltage $V_{DD}$.

The driver 36 includes n-channel MOS transistors T18, T20, T21 and T22, and p-channel MOS transistor T19. When the node N2 is charged up, the MOS transistor T18 transfers a charge at the node N2 to a node N3. The MOS transistors T19 and T20 implement a CMOS inverter, which outputs a signal having the polarity opposite to the polarity at the node N2. The MOS transistor T21 is turned ON due to the charge-up potential at the node N3, and then applies the potential of the clock signal $\phi_2$, as the word line signal, to a word line connected thereto. The MOS transistor T22 is turned ON due to an output signal of the CMOS inverter when the node N2 becomes connected to ground, and thereby connects the word line to ground. As described in detail later, the word line is discharged through the MOS transistor T21. For this purpose, the internal address bits IA1 and IA2 must be kept latched by the row address latch circuit 23 during the discharge operation for the word line WL. Similarly, the other internal address bits are kept latched during the discharge operation. When the row address latch circuit 23 is reset, both the internal addresses IA1 and IA2 are switched to the low level. Similarly, the other internal address bits are kept latched during the discharge operation, and are then reset. In this manner, a word line can be designated by arbitrary combinations of the internal address bits IA0–IAn and $\overline{IA0}$–$\overline{IAn}$, and is discharged.

Figure 9:
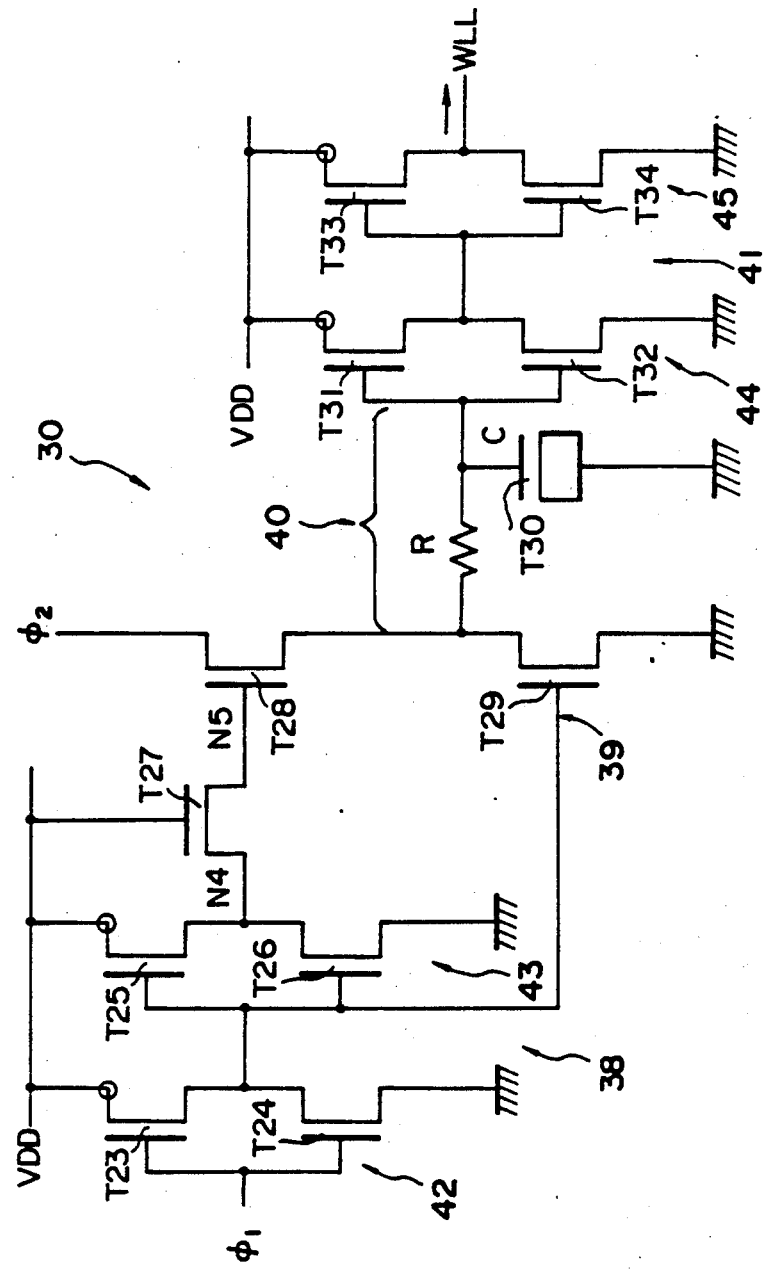
FIG. 9 is a circuit diagram of a dummy circuit 30 shown in FIG. 5.

FIG. 9 shows a circuit configuration of the dummy circuit 30. The dummy circuit 30 is made up of a dummy decoder part 38, a dummy driver part 39, a dummy word line part 40, and a waveform shaping part 41. The dummy decoder part 38 includes a CMOS inverter 42 consisting of MOS transistors T23 and T24, and a CMOS inverter 43 consisting of MOS transistors T25 and T26. The dummy decoder part 38 charges a node N4 up to the power source voltage $V_{DD}$, when the clock signal $\phi_1$ is switched to the high level. The dummy driver part 39 includes n-channel MOS transistors T27, T28 and T29. The MOS transistor T27 transfers a charge at the charged-up node N4 to a node N5. Thereby the MOS transistor T28 is turned ON, and then supplies the dummy word line part 40 with the potential of the clock signal $\phi_2$. The MOS transistor T29 is kept ON during a time when the clock signal $\phi_1$ is maintained at the low level, and thereby connects the dummy driver part 39 to ground. The dummy word line part 40 contains a resistor R provided by a patterned polysilicon line having a predetermined length, and a capacitor C having a stray capacitance formed across channel of a MOS transistor T30. The dummy word line part 40 has a resistance and a capacitance which together exhibit an electrical characteristic (a RC filter characteristic) identical to that of actual word lines formed in the memory cell array 29. The waveform shaping part 41 includes a CMOS inverter consisting of MOS transistors T31 and T32 and a CMOS inverter consisting of MOS transistors T33 and T34. The waveform shaping part 41 shapes the waveform of the signal derived from the dummy word line part 40. The waveform-shaped signal derived from the inverter is outputted, as the potential signal WLL, to the timing circuit 22. It is noted that since the resistor R and the capacitor C of the dummy word line part 40 provide an electrical characteristic which corresponds to that of the actual word lines, the change in potential of the actual word line can be identified by knowing the potential change of the CR dummy line.

Figure 10:
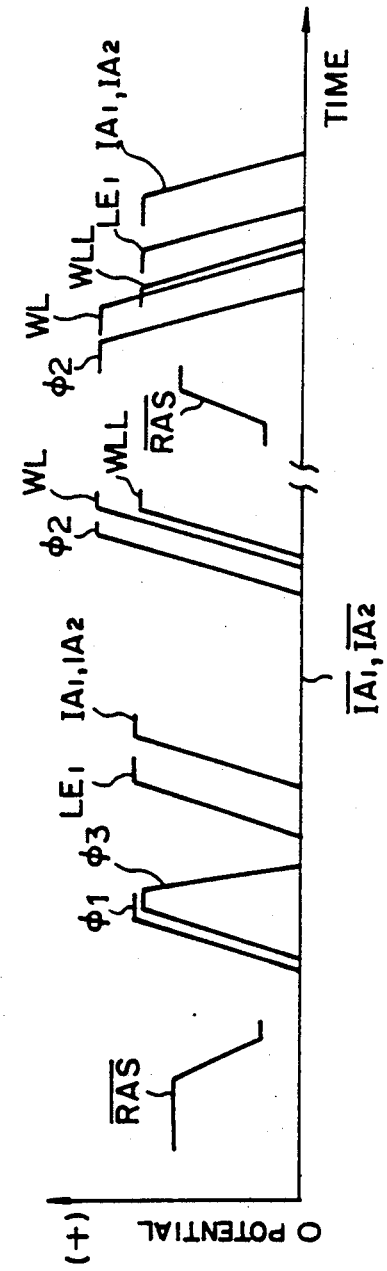
FIG. 10 is a timing chart of signals in the DRAM of FIG. 5.

A description is given of an operation of the DRAM with reference to FIG. 10. In FIG. 10, a horizontal axis denotes a time, and a vertical axis denotes a potential.

In the present embodiment, various operation modes may be obtained by the row address strobe signal $\overline{RAS}$, the column address strobe signal $\overline{CAS}$ and the write enable signal $\overline{WE}$, as in case of the conventional DRAM. The operation modes include a read mode, a write mode, a read-modified write mode, and a page mode. In the following description, the read mode is explained by way of an example.

The read mode is a mode where in a state when the write enable signal $\overline{WE}$ is maintained at the high level, one memory cell is designated during one memory cycle (corresponding to one period of the row address strobe signal $\overline{RAS}$), and then a datum is read out from the designated memory cell. The designation of one memory cell is carried out by the external address signal A0–An (row address) which is entered into the row address latch circuit 23 at the time of the fall of the row address strobe signal $\overline{RAS}$, as well as the external address signal A0–An (column address) which is entered into the column address latch circuit 24 at the time of the fall of the column address strobe signal $\overline{CAS}$. In the following description, there is explained an operation from the input of the row address to the selection of a word line designated by the input row address.

At the commencement of the operation, as shown in FIG. 10, the clock signal $\phi_3$ generated by the timing circuit 22 is switched to the high level when the predetermined time elapses after the fall of the row address strobe signal $\overline{RAS}$. The clock signal $\phi_3$ is fed to the row address latch circuit 23, which turns ON the MOS transistors T9 and T10 in response to the level change of the clock signal $\phi_3$. Thereby, the row address latch circuit 23 latches the external address bits A0–An and produces the internal address bits IA0–IAn and $\overline{IA0-IAn}$. These internal address bits, depending on a combination of levels of the external address bits A0–An, are supplied in parallel to the row address decoder 25.

The row address decoder 25 decodes the internal address bits IA0–IAn and $\overline{IA0-IAn}$. For example, when the internal address bits IA1 and IA2 are at the high level, the MOS transistors T14 and T15 of the NAND type decoder 35 are turned ON, and thereby the node N2 is charged up to the power source voltage $V_{DD}$. The charge at the node N2 is transferred to the node 3 through the MOS transistor T18. The MOS transistor T21 is then turned ON due to the potential at the node N3. The MOS transistor T21 is supplied, from the timing generator 22, with the clock signal $\phi_2$ which is switched to the high level after the clock signal $\phi_1$ is switched to the high level. The clock signal $\phi_2$ is supplied to the corresponding word line through the MOS transistor T21 which is kept ON. That is, this word line is one of the word lines extending in the row direction, and is selected by the combination of the external address bits A0–An. Then the potential of the selected word line begins to be increased to the power source voltage $V_{DD}$ in accordance with a rising curve which depends on the resistance and stray capacitance of the selected word line.

On the other hand, when the clock signal $\phi_1$ is switched to the high level, the dummy decoder part 38 of the dummy circuit 30 shown in FIG. 9 is activated, and thereby the node N4 is charged up to the power source voltage $V_{DD}$. The charge at the node N4 is transferred to the node N5 through the MOS transistor T27, so that the MOS transistor T28 is turned ON. Thereby, the clock signal $\phi_2$ is supplied to the dummy word line part 40, and the resistor R and capacitor C of the dummy word line part 40 are charged up to the power source voltage $V_{DD}$. As described previously, the resistance R and capacitance C are selected so as to be equal to the resistance and capacitance of the actual word lines. It is noted that the resistances and capacitances of all the word lines in the DRAM devices are almost the same. Therefore, the potential signal WLL outputted from the waveform shaping part 41 exhibits a change in potential which is almost the same as a change in potential of the actual word line.

When the row address strobe signal $\overline{RAS}$ rises after the predetermined time elapses, the clock signal $\phi_2$ generated by the timing circuit 22 is switched to the low level. Correspondingly, the potential of the selected word line WL begins to decrease, and at almost the same time, the potential signal WLL derived from the dummy circuit 30 begins to decrease. The potential signal WLL which begins to decrease, is supplied to the timing circuit 22. The inverter 32 of the timing circuit 22 sets the output at the low level, when the potential of the potential signal WLL becomes equal to or lower than the predetermined potential. Then, the output of the NAND circuit 33, or the latch enable signal LE1, is reset to the low level. Then the latch of the external address in the row address latch circuit 23 is ended, and thereby the read mode is completed.

The following matters should be particularly appreciated. The embodiment uses the dummy word line part 40 which has an electrical characteristic almost identical to the electrical characteristic of the actual word lines. The dummy word line part 40 is subjected to the charge-up and discharge operation which is carried out for the actual word line. The potential change of the dummy word line part 40 corresponds to the potential change of the actual word line. Therefore when the potential of the dummy word line part 40 decreases to the predetermined low potential, the potential of the actual word line also decreases to the predetermined low potential. Then, the address latched by the row address latch circuit 23 is reset.

With this operation, it becomes possible to determine the reset timing of the address signal in response to the decrease in potential of the word line. Therefore, it is unnecessary to provide the time margin $t_\alpha$, and to thereby shorten the precharge time $t_{RP}$. As a result, the cycle time $t_{RC}$ can be reduced and the number of times of read or write operation can be increased.

Figure 11:
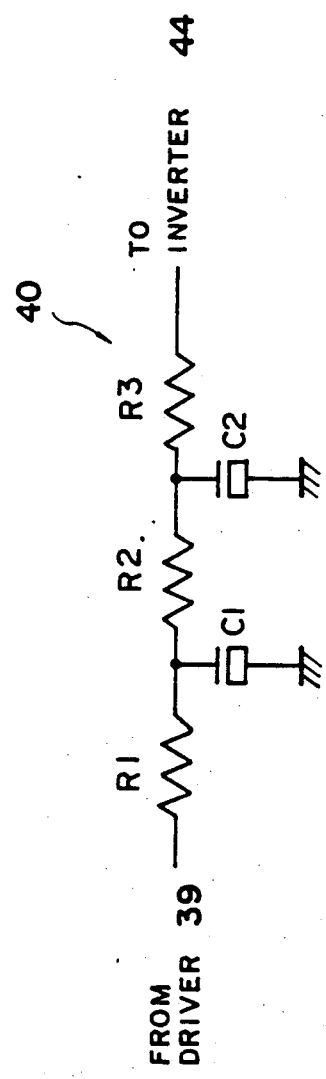
FIG. 11 is a circuit diagram which may be used in place of a dummy word line part 40 shown in FIG. 9.

The dummy word line part 40 shown in FIG. 9 may be constructed by a circuit including a plurality of resistors and capacitors as shown in FIG. 11. The circuit of FIG. 11 comprises a plurality of RC filters connected in series. The illustrated circuit consists of three resistors R1, R2 and R3 and two capacitors C1 and C2. The circuit of FIG. 11 has a distribution of resistance and capacitance which is more similar to that of an actual word line. Alternatively, the reset of the address latch may be possible based on the actual potential change of the actual word lines. In this case, the potential changes of all the word lines must be detected, because it cannot be found which one of the word lines changes in potential.

The column address latch circuit 24 and the column address decoder 26 may be implemented by conventional circuits. Normally, the column address decoder 26 is of a static column type implemented by a static random access memory, and therefore it is unnecessary to keep the column address latched until the column address is released from the latched state. The clock signals $\phi_1$, $\phi_2$ and $\phi_3$ are identical to clock signals used in conventional DRAMs. In other words, the timing circuit 22 is the same as a conventional timing circuit except for the circuit shown in FIG. 6. The control circuit 21, the sense amplifier 27 and the I/O circuit 28 may be implemented by conventional circuits.

The present invention is not limited to the above embodiments, and variations and modifications may be made without departing from the scope of the present invention.

What is claimed is:

1. A dynamic random access memory comprising:
   a memory cell array having a plurality of memory cells coupled to word lines and bit lines;
   row address latch means for latching an external address signal when a latch enable signal is switched to a first level and for generating a first internal address signal, an address latch being reset when a latch enable signal is switched to a second level;
   column address latch means for latching the external address signal after the latch by the row address latch means and generating a second internal address signal;
   row address decoder means for decoding the first internal address to select one of the word lines and for controlling a potential of the selected word line so that the selected word line is charged up to a predetermined high level and thereafter is discharged to a predetermined low level;
   column address decoder means for decoding the second internal address signal to select one of the bit lines;
   dummy circuit means comprising a dummy word line having an electrical characteristic corresponding to that of the word lines and means for charging the dummy word line to the predetermined high level when the row address decoder means decodes the first internal address and for discharging the dummy word line to the predetermined low level when the selected word line is discharged to the predetermined low level; and
   timing means for generating the latch enable signal which is switched to the second level when the potential of the dummy word line is decreased to the predetermined low level due to the discharge operation for the dummy word line, so that the address latched by the row address latch means is reset, said timing means comprising:
   means for generating a first clock signal which defines timing for enabling the first internal address signal to be entered into the row address decoder means, and
   means for generating a second clock signal which defines timing for controlling the potential of the selected word line by the row address decoder means.

2. A dynamic random access memory as claimed in claim 1, wherein the dummy word line comprises a resistor and a capacitor which implement an RC filter.

3. A dynamic random access memory as claimed in claim 1, wherein the dummy word line comprises a plurality of filters connected in series, each filter comprising a resistor and a capacitor.

4. A dynamic random access memory as claimed in claim 1, wherein the dummy word line is implemented by a polysilicon line formed on a semiconductor wafer and a metal oxide semiconductor (MOS) transistor, the polysilicon line functioning as a resistor and the MOS transistor providing a capacitor, as formed across a channel thereof.

5. A dynamic random access memory as claimed in claim 1, wherein the dummy circuit means further comprises a dummy decoder portion comprising first and second inverters, the first inverter receiving the first clock signal, and the second inverter receiving an inverted first clock signal supplied from the first inverter, driver means for driving the dummy word line in accordance with output signals of the first and second inverters, and waveform shaping means for shaping a waveform of the potential signal on the dummy word line, a waveform-shaped potential signal being supplied to the timing means.

6. A dynamic random access memory as claimed in claim 5, wherein the driver means comprises first and second n-channel MOS transistors, the source of the first MOS transistor being connected to the drain of the second MOS transistor, and wherein the output signal of the first inverter is supplied to the gate of the second MOS transistor, the output signal of the second inverter is supplied to the gate of the first MOS transistor through an n-channel MOS transistor gate, the second clock signal is supplied to the drain of the first MOS transistor, the source of the second MOS transistor is connected to ground, and the dummy word line is connected to a node at which is source of the first MOS transistor is connected to the drain of the second MOS transistor.

7. A dynamic random access memory as claimed in claim 5, wherein the waveform shaping means comprises two inverters which are connected in series.

8. A dynamic random access memory comprising:
   a memory cell array having a plurality of memory cells coupled to word lines and bit lines;
   row address latch means for latching an external address signal when a latch enable signal is switched to a first level and for generating a first internal address signal, an address latch being reset when a latch enable signal is switched to a second level;
   column address latch means for latching the external address signal after the latch by the row address latch means and generating a second internal address signal;
   row address decoder means for decoding the first internal address to select one of the word lines and for controlling a potential of the selected word line so that the selected word line is charged up to a predetermined high level and thereafter is discharged to a predetermined low level;

column address decoder means for decoding the second internal address signal to select one of the bit lines;

dummy circuit means comprising a dummy word line having an electrical characteristic corresponding to that of the word lines and means for charging the dummy word line to the predetermined high level when the row address decoder means decodes the first internal address and for discharging the dummy word line to the predetermined low level when the selected word line is discharged to the predetermined low level; and timing means for generating the latch enable signal which is switched to the second level when the potential of the dummy word line is decreased to the predetermined low level due to the discharge operation for the dummy word line, so that the address latched by the row address latch means is reset, said timing means comprising:

delay means for delaying a row address strobe signal supplied from an external circuit by a predetermined time;

an inverter for inverting the potential of the dummy word line, and a NAND circuit performing a NAND operation between an output signal of the inverter and a delayed row address strobe signal supplied from said delay means.

9. A dynamic random access memory comprising:

a memory cell array having a plurality of memory cells coupled to word lines and bit lines;

row address latch means for latching an external address signal when a latch enable signal is switched to a first level and for generating a first internal address signal, an address latch being reset when a latch enable signal is switched to a second level;

column address latch means for latching the external address signal after the latch by the row address latch means and generating a second internal address signal;

row address decoder means for decoding the first internal address to select one of the word lines and for controlling a potential of the selected word line so that the selected word line is charged up to a predetermined high level and thereafter is discharged to a predetermined low level;

column address decoder means for decoding the second internal address signal to select one of the bit lines;

dummy circuit means comprising a dummy word line having an electrical characteristic corresponding to that of the word lines and means for charging the dummy word line to the predetermined high level when the row address decoder means decodes the first internal address and for discharging the dummy word line to the predetermined low level when the selected word line is discharged to the predetermined low level; and timing means for generating the latch enable signal which is switched to the second level when the potential of the dummy word line is decreased to the predetermined low level due to the discharge operation for the dummy word line, so that the address latched by the row address latch means is reset, said timing means comprising:

delay means for delaying a row address strobe signal supplied from an external circuit by a predetermined time and for outputting a delayed row address strobe signal; and logical gate means for deriving said latch enable signal from said delayed row address strobe signal and the potential of said dummy word line, said logical gate means setting said latch enable signal to said first level when said delayed row address strobe signal becomes active, for maintaining said latch enable signal at said first level until a time when the potential of said dummy word line has become equal to said predetermined low level, even when said delayed row address strobe signal becomes inactive, and for resetting said latch enable signal to said second level when the potential of said dummy word line has become equal to said predetermined low level.

* * * * *